(12) United States Patent
Pramanick et al.

(10) Patent No.: US 7,543,200 B2
(45) Date of Patent: Jun. 2, 2009

(54) METHOD AND SYSTEM FOR SCHEDULING TESTS IN A PARALLEL TEST SYSTEM

(75) Inventors: Ankan Pramanick, San Jose, CA (US);
Toshiaki Adachi, San Jose, CA (US);
Mark Elston, Salinas, CA (US)

(73) Assignee: Advantest Corporation, Tokyo (JP)

( * ) Notice: Subject to any disclaimer, the term of this patent is extended or adjusted under 35 U.S.C. 154(b) by 365 days.

(21) Appl. No.: 11/062,244

(22) Filed: Feb. 17, 2005

(65) Prior Publication Data

US 2006/0195747 A1    Aug. 31, 2006

(51) Int. Cl.
G01R 31/28    (2006.01)
G11C 29/00    (2006.01)
G06F 11/00    (2006.01)

(52) U.S. Cl. .................. 714/724; 714/718; 714/742; 365/201

(58) Field of Classification Search .......... 714/100–824
See application file for complete search history.

(56) References Cited

U.S. PATENT DOCUMENTS

| | | | |
|---|---|---|---|
| 4,894,829 A | | 1/1990 | Monie et al. |
| 5,136,705 A | * | 8/1992 | Stubbs et al. ................. 714/27 |
| 5,297,150 A | * | 3/1994 | Clark ........................... 714/26 |
| 5,513,118 A | * | 4/1996 | Dey et al. ..................... 716/18 |
| 5,701,480 A | * | 12/1997 | Raz ............................. 718/101 |
| 6,061,507 A | * | 5/2000 | Fitzgerald et al. ............... 716/2 |
| 6,205,567 B1 | * | 3/2001 | Maruyama ................... 714/741 |

(Continued)

FOREIGN PATENT DOCUMENTS

JP    09-062530 A    3/1997

(Continued)

OTHER PUBLICATIONS

Cochran, P. et al. (Feb. 2002). "Comparison of Final Test Handling Strategies for Massively Parallel Test of Logic Devices," in *Future Fab International*, vol. 12, located at <http://www.future-fab.com/documents.asp?d_ID=943, last visited on Jun. 5, 2006, 14 pages.

(Continued)

*Primary Examiner*—Cynthia Britt
*Assistant Examiner*—Guerrier Merant
(74) *Attorney, Agent, or Firm*—Morrison & Foerster LLP

(57) ABSTRACT

An efficient and low-cost method for testing multiple DUTs in a parallel test system is disclosed. In one embodiment, a method for scheduling tests in a parallel test system having at least two devices-under-test (DUTs) coupled to a test controller through one or more vendor hardware modules includes receiving a test plan comprising a plurality of tests arranged in a predetermined test flow, where the predetermined test flow comprises a plurality of tests arranged in a directed graph and each test is arranged as a vertex in the directed graph, determining a test execution schedule in accordance with the test plan at runtime, where the test execution schedule identifies a set of next tests to be executed according to current states of the at least two DUTs and where the set of next tests include different tests to be performed on different DUTs, and testing the at least two DUTs using the test execution schedule.

20 Claims, 6 Drawing Sheets

U.S. PATENT DOCUMENTS

| | | | |
|---|---|---|---|
| 6,415,396 B1* | 7/2002 | Singh et al. | 714/38 |
| 6,557,128 B1* | 4/2003 | Turnquist | 714/724 |
| 6,691,079 B1* | 2/2004 | Lai et al. | 703/16 |
| 6,868,513 B1* | 3/2005 | Botala et al. | 714/738 |
| 6,927,591 B2* | 8/2005 | McCord | 324/765 |
| 7,035,755 B2* | 4/2006 | Jones et al. | 702/121 |
| 2003/0005375 A1* | 1/2003 | Krech et al. | 714/724 |
| 2003/0126534 A1* | 7/2003 | Roy et al. | 714/742 |
| 2004/0015846 A1* | 1/2004 | Haisraeli | 717/115 |
| 2004/0225459 A1 | 11/2004 | Krishnaswamy et al. | |
| 2005/0102589 A1* | 5/2005 | Park et al. | 714/718 |
| 2005/0262412 A1 | 11/2005 | Mukai et al. | |
| 2006/0015785 A1* | 1/2006 | Chun | 714/724 |

FOREIGN PATENT DOCUMENTS

| | | |
|---|---|---|
| WO | WO-2004/072670 A1 | 8/2004 |
| WO | WO-2006/088238 A1 | 8/2006 |

OTHER PUBLICATIONS

International Search Report mailed on Jul. 24, 2006 for PCT Application No. PCT/JP2006/303337 filed on Feb. 17, 2006, 6 pages.

Nigh, P. (Oct. 2002). "Scan-Based Testing: The Only Practical Solution for Testing ASIC/Consumer Products," in *Proc. 2002 IEEE* presented at International Test Conference:Essex Junction, VT, Panel P3.4, pp. 1198.

Pramanick, A. et al. (Oct. 2004). "Test Programming Environment in a Modular, Open Architecture Test System," *IEEE* presented at ITC International Test Conference:Charlotte, NC on Oct. 26-28, 2004, Paper 14.2, pp. 413-422.

Rivoir, J. (Apr. 2005) . "Parallel Test Reduces Cost of Test More Effectively than Just a Cheaper Tester," *IEEE* presented at 29th International Electronics Manufacturing Technology Symposium:San Jose, CA on Jul. 14-16, 2004, Session 10, pp. 263-272.

Rivoir, J. (Nov. 2003). "Lowering Cost of Test: Parallel Test of Low-Cost ATE?" *IEEE* presented at 12th Asian Test Symposium:X-ian, China on Nov. 16-19, 2003, pp. 360-363.

* cited by examiner

METHOD AND SYSTEM FOR SCHEDULING TESTS IN A PARALLEL TEST SYSTEM

FIELD OF THE INVENTION

The present invention relates to the field of automated test equipment (ATE) for semiconductor testing. In particular, the present invention relates to a method and system for scheduling tests in a parallel test system.

BACKGROUND OF THE INVENTION

Parallel testing is a traditional ATE technique to increase throughput without a corresponding increase in cost, by performing tests on multiple devices-under-test (DUTs) at the same time. Low-cost ATE has often been promoted as a solution to reduce the cost of test. Parallel testing is another approach, which has been shown to reduce test cost more effectively than low-cost ATE by J. Rivoir in "Lowering Cost of Test: Parallel Test or Low-Cost ATE?" Proc. $12^{th}$, Asian Test Symposium, November 2003, pp. 361-368. This is because parallel testing reduces all factors contributing to the cost of testing, and not just the capital cost of ATE. An analysis of test benchmarking data is given in "Comparison of Final Test Handling Strategies for Massively Parallel Test of Logic Devices," by P. Cochran, etc. in Future Fab International, Vol. 12, Feb. 2002. The analysis indicates that maximizing parallelism impacts the cost of test to a great degree. According to Cochran, up to a 50% reduction in test cost was observed by testing four devices in parallel instead of each one serially.

There has long been significant interest in achieving efficient multi-DUT testing, through either scan-based techniques or traditional ATE parallel test techniques. An example of the scan-based techniques is described in "Scan-based Testing: The Only Practical Solution for Testing ASIC/Consumer Products," by P. Nigh in Proc. 2002 IEEE International Test Conference, October 2002, pp. 1198. Examples of traditional ATE parallel test techniques are described in "Pattern Based Test: Key to Parallel Test Efficiency in Multi-Site Analog and Mixed-Signal Device Testing," by J. Weimer, and also described in "Parallel Test Reduces Cost of Test More Effectively than Just a Cheaper Tester," by J. Rivoir, both papers to be presented at the $7^{th}$ European Manufacturing Test Conference, April 2005. The above publications are incorporated herein in their entirety by reference. Hence, many ATE manufacturers currently support parallel multi-DUT testing in one form or another.

For example, parallel testing is supported by Advantest Corporation's T2000 system through its multi-Site Controller environment. As shown in FIG. 1, each Site Controller (SiteC) 104 is responsible for controlling a single DUT 108 through a vendor hardware module 106, while the System Controller (SysC) 102 runs multiple SiteCs 104 concurrently. Such a multi-SiteC environment is more suited for System-on-Chip (SOC) device testing applications, because of the intensive and time-consuming data analysis requirements, such as fast Fourier transform (FFT) analyses, which are typically found in SOC devices.

However, it is a rather restricted market segment that can afford the extra cost of manufacturing high-value devices with larger pin counts. Many integrated circuit (IC) devices are inexpensive, and have smaller pin counts. A smaller device requires less hardware resources, in general, which implies that a larger number of smaller DUTs can be tested at the same time than bigger DUTs. If testing each smaller DUT were to require an entire SiteC, the cost of the ATE system and the cost of testing would increase accordingly. This cost versus throughput trade-off makes a single SiteC-based parallel test system quite desirable. Therefore, there is a need for performing parallel testing with a single SiteC, and there is a need for scheduling tests efficiently in testing multiple DUTs coupled to a single SiteC in a parallel test system.

SUMMARY

An efficient-and low-cost method for testing multiple DUTs in a parallel test system is disclosed. In one embodiment, a method for scheduling tests in a parallel test system having at least two devices-under-test (DUTs) coupled to a test controller through one or more vendor hardware modules includes receiving a test plan comprising a plurality of tests arranged in a predetermined test flow, where the predetermined test flow comprises a plurality of tests arranged in a directed graph and each test is arranged as a vertex in the directed graph, determining a test execution schedule in accordance with the test plan at runtime, where the test execution schedule identifies a set of next tests to be executed according to current states of the at least two DUTs and where the set of next tests include different tests to be performed on different DUTs, and testing the at least two DUTs using the test execution schedule.

In another embodiment, a parallel test system includes a test controller, one or more vendor hardware modules coupled to the test controller, and at least two devices-under-test (DUTs) coupled to each hardware module in parallel. The parallel test system further includes means for receiving a test plan comprising a plurality of tests arranged in a predetermined test flow, where the predetermined test flow comprises a plurality of tests arranged in a directed graph and each test is arranged as a vertex in the directed graph, means for determining a test execution schedule in accordance with the test plan at runtime, where the test execution schedule identifies a set of next tests to be executed according to current states of the at least two DUTs and the set of next tests include different tests to be performed on different DUTs, and means for testing the at least two DUTs using the test execution schedule.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

DESCRIPTION OF EMBODIMENTS

Methods and systems are provided for scheduling tests in a parallel test system. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 2A:
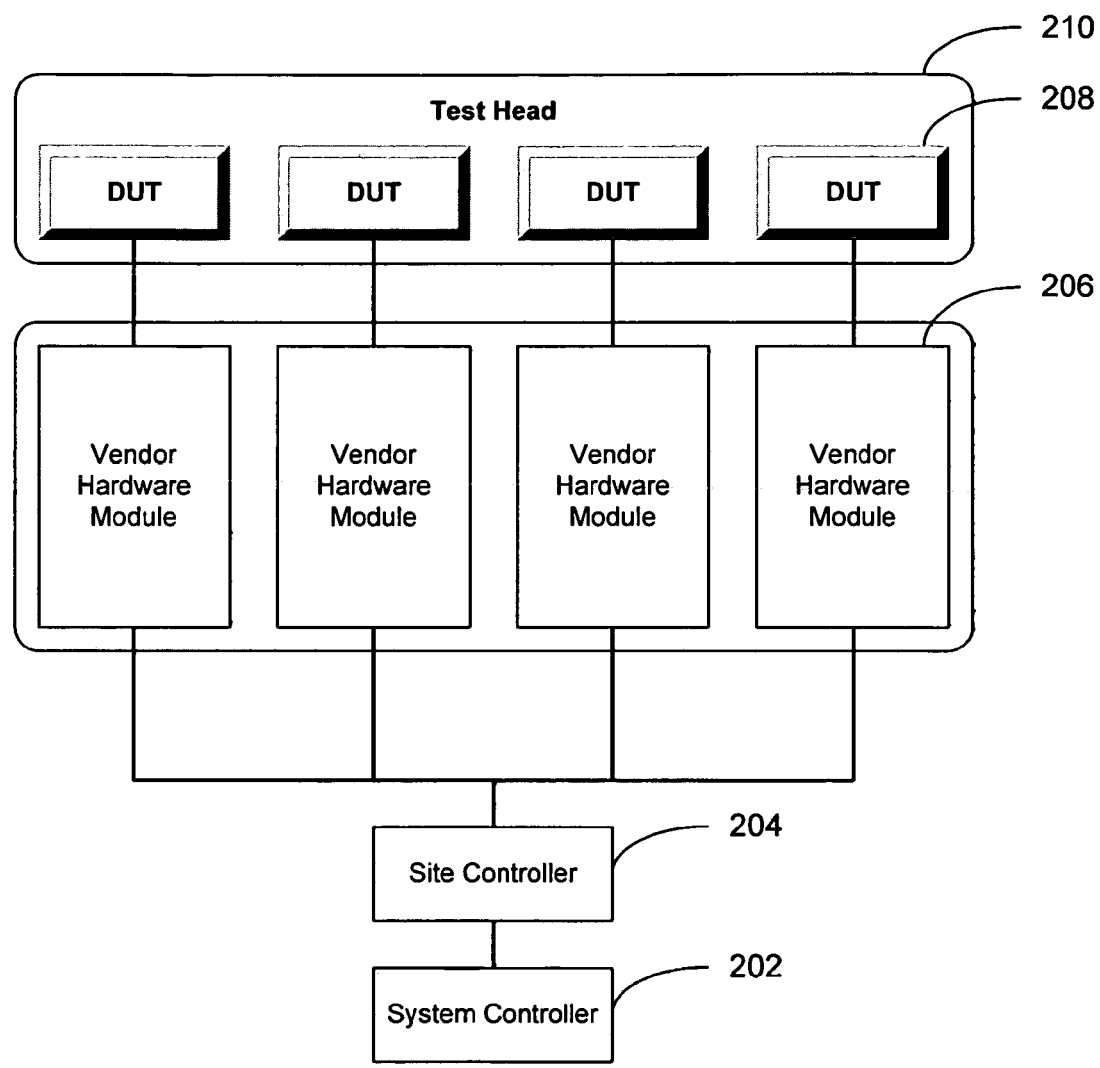
FIG. 2a illustrates a system for parallel testing of multiple DUTs with a single SiteC according to an embodiment of the present invention.
Figure 2B:
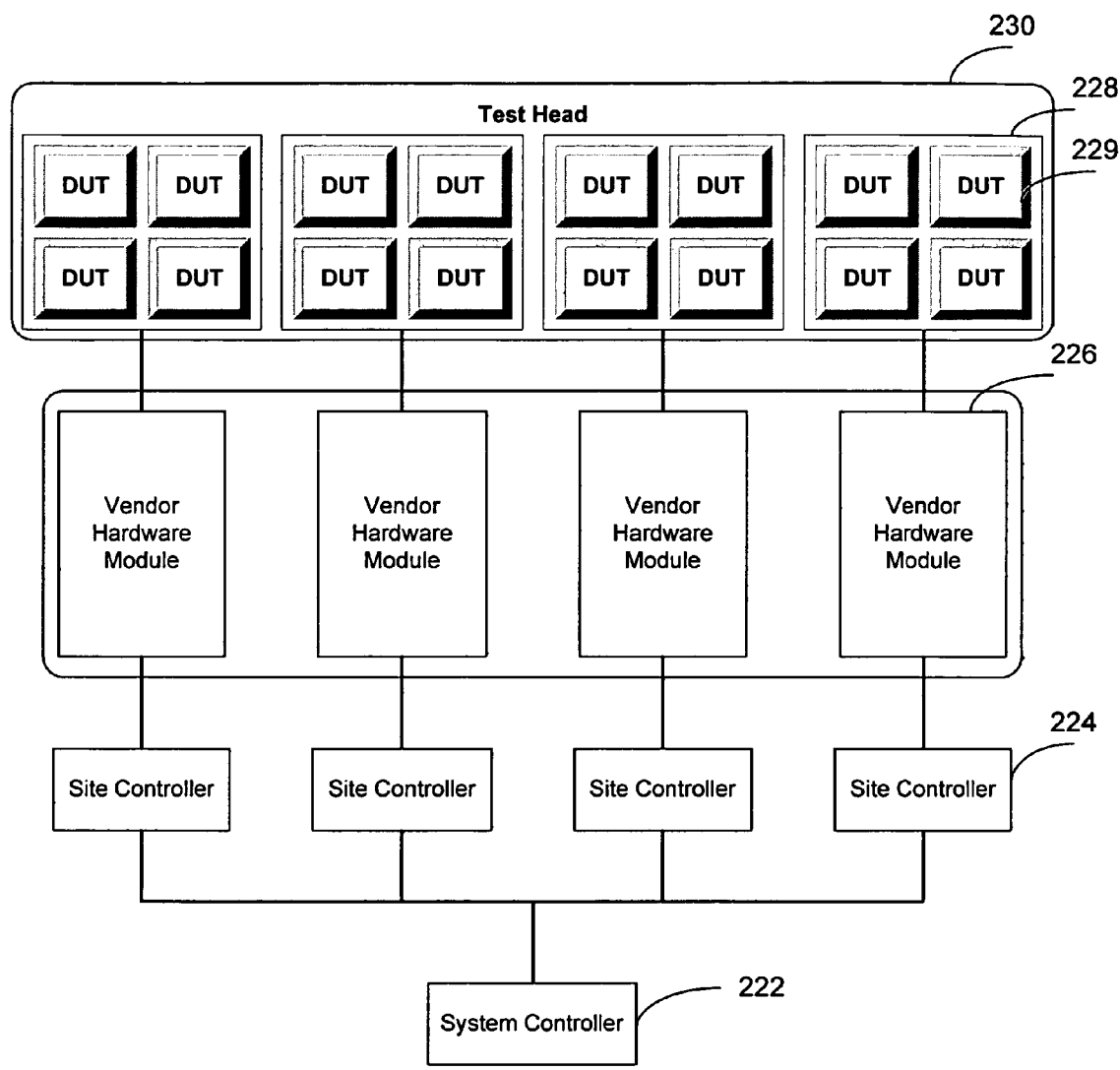
FIG. 2b illustrates another system for parallel testing of multiple DUTs with one or more SiteCs according to an embodiment of the present invention.

FIG. 2a illustrates a system for parallel testing of multiple DUTs with a single SiteC according to an embodiment of the present invention. The system includes a System Controller 202, a Site Controller 204, a plurality of vendor hardware modules 206, and the corresponding plurality of DUTs 208. The test head 210 may hold multiple DUTs. FIG. 2b illustrates another system for parallel testing of multiple DUTs with one or more SiteCs according to an embodiment of the present invention. The system includes a System Controller 222, a plurality of Site Controllers 224, a plurality of vendor hardware modules 226, and the corresponding group of DUTs 228, each group of DUTs may include one or more individual DUTs 229. The test head 230 may hold multiple DUTs.

In one embodiment, the System Controller and the Site Controller(s) may be implemented by a distributed computing system with multiple computers in multiple geographical locations. In another embodiment, the System Controller and the Site Controller may be implemented by a single computer, which is also referred to as a test controller. The test controller and the plurality of vendor hardware modules provide the means for scheduling tests in the parallel test system described below. The means for scheduling tests includes means for receiving a test plan comprising a plurality of tests arranged in a predetermined test flow, means for determining a test execution schedule in accordance with the test plan at runtime, and means for testing the at least two DUTs using the test execution schedule.

Figure 1:
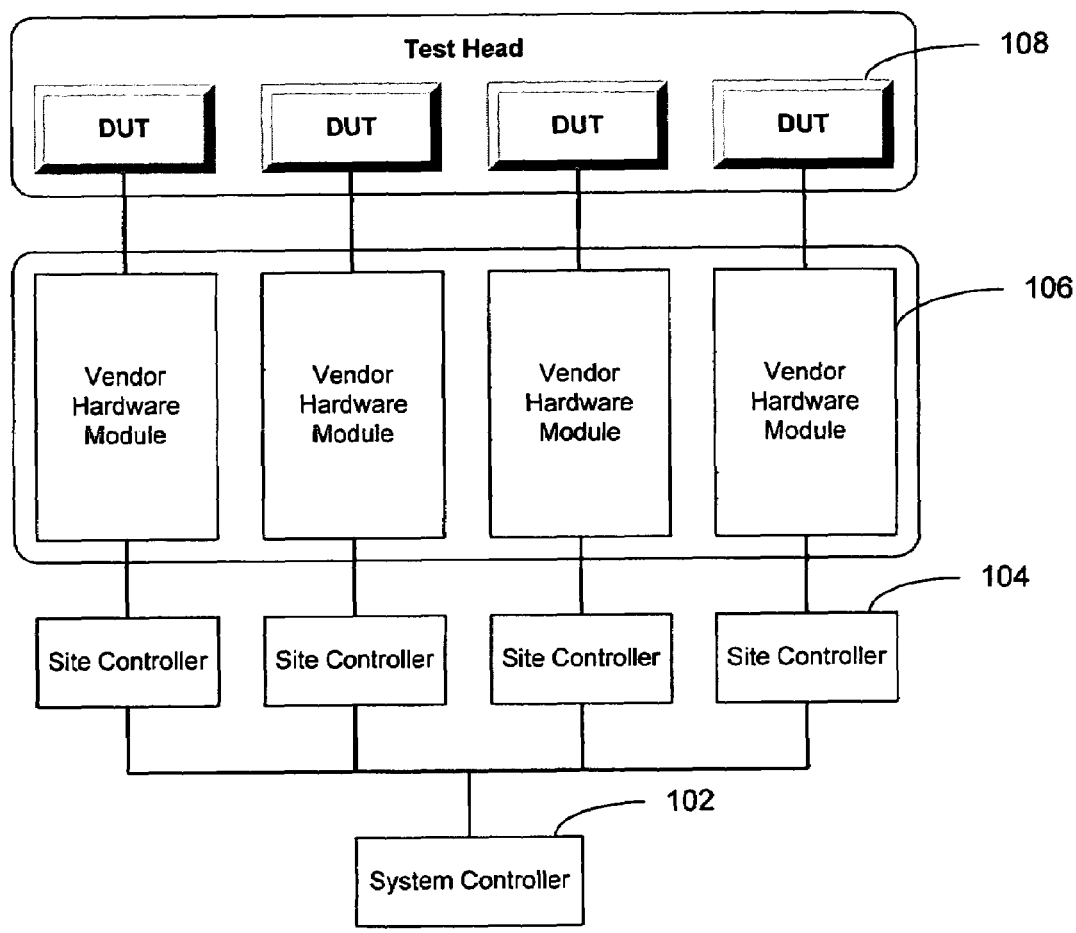
FIG. 1 illustrates a system for parallel testing of multiple DUTs with a single-SiteC-per-DUT configuration.

The configuration of FIG. 1 requires software sequencing of test activities across the DUT sites, since only a single SiteC is involved. In the following section, the features that vendor hardware modules are required to support in order to integrate into an efficient parallel test system are described.

The parallel test system makes use of the following hardware features to reduce the overhead associated with using a single SiteC to control the testing of several DUTs at the same time.

Automatic replication of pattern data across DUTs: This feature allows the user to create and supply patterns for only a single DUT, and allows the tester operating system (TOS) to transfer the pattern data for only a single DUT. The vendor hardware module control software will transmit this data simultaneously to all the resources servicing the DUTs in a SiteC partition, using the broadcast capabilities of the open architecture test system module connection enabler (MCE).

Automatic replication of test conditions across DUTs: This feature allows the user to specify test conditions (i.e., resource settings) for a single DUT, and the TOS, through the vendor hardware module functionality, replicates this simultaneously for all the DUT sites. This feature reduces the overhead associated with the sequential loading of test conditions for all the DUTs, one at a time. Note that while this mode is used for loading of non-DUT-specific (i.e., identical) resource settings, there is internal TOS support to allow, if required, different resource setting values for different DUTs.

Hardware accumulation of DUT-specific test results: In the absence of this feature, the software has to retrieve and analyze per-pin results for each pin across all the DUTs in order to determine which DUTs have passed and which DUTs have failed. Repeating this procedure for hundreds or thousands of executed patterns adds significant overhead to the system. Hence, the hardware supports the accumulation of DUT-specific per-pin test results, and detection and storage of the pass/fail status of each DUT being tested.

In addition to the above requirements on the vendor hardware module, which serve simply to reduce the overhead of parallel DUT testing on a single SiteC, there is further support necessary for hardware state control from vendor hardware module control software. Consider the scenario where, in the course of executing a test flow during parallel testing, any DUT that is determined to have failed, and no longer needs to be tested (at least for some time), needs to be "rejected" (or temporarily "excluded" or placed "on-hold" from the flow, for whatever reason). The system needs to electrically isolate such DUTs from the tester hardware, so that power supply voltage is no longer applied to those DUTs, and no input stimulus is provided to them. Also, for excluded (i.e., on-hold) DUTs that need to be reinstated into the test flow, the electrical conditions enabling testing would need to be reestablished. Thus, if required, the vendor hardware module control software should provide appropriate methods that enable the TOS to accomplish these tasks.

The next section describes the methodology for parallel DUT testing in a single SiteC, the test flow under the constraints of multi-DUT testing, and the state transitions that DUTs undergo as they progress through the test flow. These are fundamentally different from the single DUT case.

A test flow is a critical element of the user's test plan, and the vehicle through which user-defined tests are executed in an open architecture test system. A detailed description of an open architecture test system is provided by U.S. application No. 60/447,839, "Method and Structure to Develop a Test Program for Semiconductor Integrated Circuits," filed Feb. 6, 2004, and by U.S. application No. 60/573,577, "Software Development in an Open Architecture Test System," filed May 22, 2004, both of which are assigned to the assignee of the present invention, and both of which are incorporated herein in their entirety by reference.

In an open architecture test system, user tests implement the system-defined interface ITest, which in turn derives from the system-defined interface IFlowable. A flow object encapsulates a finite state machine. It comprises several flow items which run an IFlowable object and then transition to another flow item. A flow item defines a state in the finite state machine of the Flow. It is an item in a test flow graph, and on testers a flow item is a test. Executing an IFlowable involves executing an object that implements the IFlowable interface. Typical objects that implement the IFlowable interface are tests, which implement ITest, and Flows themselves. In summary, a test flow has flow items that run Tests and other Flows, and then transition to another flow item. The transitions are programmed by the user, and are based on the return results from IFlowables. The flow item also provides for the opportunity to call user-customized routines on various return results from running an IFlowable.

In a single-DUT-per-SiteC environment, only a single flow item can be executing a test (i.e., an IFlowable) on the DUT at any given time during the execution of the test flow. However, during parallel testing, it may happen that due to different DUTs producing different results on the execution of a particular test, as dictated by the flow state transitions, some of the DUTs progress to a different flow item than some of the others. This leads to the situation that at some instant of time, a different test needs to be executed on one set of DUTs than on another. In majority of cases (and in typically digital applications), the same vendor hardware module may not be capable of running two different tests at the same time. This dictates that the following restriction, which is naturally present in the single DUT environment, valid during the execution of tests in a multi-DUT environment. That is, at any given instant of time during the execution of a test flow, only a single flow item can be active (i.e., executing its IFlowable). The discussion below is based on the premise that this criterion is satisfied in the parallel DUT testing environment.

In one embodiment, a single instance of the flow object is itself aware of the fact that several DUTs are being tested in parallel, and fulfils the criterion that only a single flow item can be active by adopting a proper test execution scheduling method. With a proper design of the scheduling method, this approach can ensure that the maximum numbers of DUTs that require a test execution through a particular flow item are accommodated. Note that serialization of test execution for DUTs may still occur when hardware resource limitations exist.

In a parallel test environment that uses a single test flow, it is useful to define the categories under which a particular DUT may be classified at any given time, and the states it can possibly be in with respect to its progress through an executing test flow. The following are the categories a DUT can be placed in, specific to a particular Site Controller, some of which are dynamically updated during flow execution:

Defined: This category consists of all the DUTs defined in the socket file for that SiteC. The membership in the category of Defined DUTs is decided at the time the test plan is loaded using the socket file, and remains unchanged for the lifetime of the loaded test plan.

Loaded: This category consists of the DUTs defined in the socket file and enabled (i.e., not disabled) for that SiteC. At any given time, Loaded=Defined−{disabled DUTs}. Thus, the category Loaded corresponds, for example, to all the DUTs loaded onto a loadboard for package testing (as provided by the handler), or all the DUTs in contact with a prober card (through chuck-up of the wafer prober stage). Normally, the set Loaded is equivalent to the set Defined, unless the set Loaded has been explicitly changed by an external entity. In the manufacturing test environment, for example, this change is effected by the user's automation tool, possibly before each execution of the test plan. However, once the test plan execution begins, the set of Loaded DUTs is invariant for the duration of the test plan execution.

Measurable: This category includes all DUTs from the set Loaded that have not yet been rejected (i.e., removed permanently from any further testing). This is updated dynamically during flow execution, as DUTs are rejected in the course of testing. At any given time, Measurable=Loaded−{Rejected DUTs}.

On-Hold: This category includes DUTs that, while not rejected, have been temporarily suspended (i.e., placed on hold) from testing. DUTs need to be placed on hold to perform test execution on multiple DUTs sequentially, either because of the lack of hardware resources for testing the DUTs simultaneously, or due to flow execution scheduling requirements. In the former case, the user test class places DUTs on hold, while in the latter case, the flow scheduling method places DUTs on hold. Thus, the membership in this category is updated dynamically during the course of flow execution. Note that an On-Hold DUT is still a member of the Measurable category.

Active: The category of Active DUTs are currently undergoing (or just about to undergo) test execution. The change in the number of DUTs placed on hold or rejected automatically affects this set over the course of flow execution. At any given time, Active=Measurable−On-Hold.

Rejected: This is the category of DUTs, out of the Loaded set, that have been removed permanently from any further testing. The membership in this category is determined by the decision logic in the user's DUTFlowItem definition.

Of the six categories listed above, three categories, namely Active, On-Hold, and Rejected, can actually be considered to be the possible states a given DUT can be in as it progresses through the test flow. As will be discussed below, the test flow makes use of these states extensively while scheduling DUT execution in a parallel test environment.

As described above, a test flow represents a finite state machine. For the purposes of this discussion, another convenient way to envision a test flow is as a directed graph, in which each vertex represents a flow item, which encapsulates the test to be executed, and each directed edge represent the transition the flow execution has to make from a source flow item to a destination flow item, based on the value of the return result from the execution of the source flow item's test.

Note that a test flow graph, by construction, is weakly connected, i.e., there is no vertex in the test flow graph that is isolated and cannot be reached from any other vertex. Also note that each flow item vertex in the flow graph may also encapsulate another test flow, since test flows in an open architecture test system are themselves also IFlowables. Note further that all test flow graphs have a natural source vertex, which is the entry point for the flow execution. A top-level flow also has a natural sink vertex, which is the exit point for the flow execution (embedded flows just "return" to the caller). These two special vertices are not flow items, but represent important singularities through which all DUTs being tested by that flow have to pass.

Figure 3A:
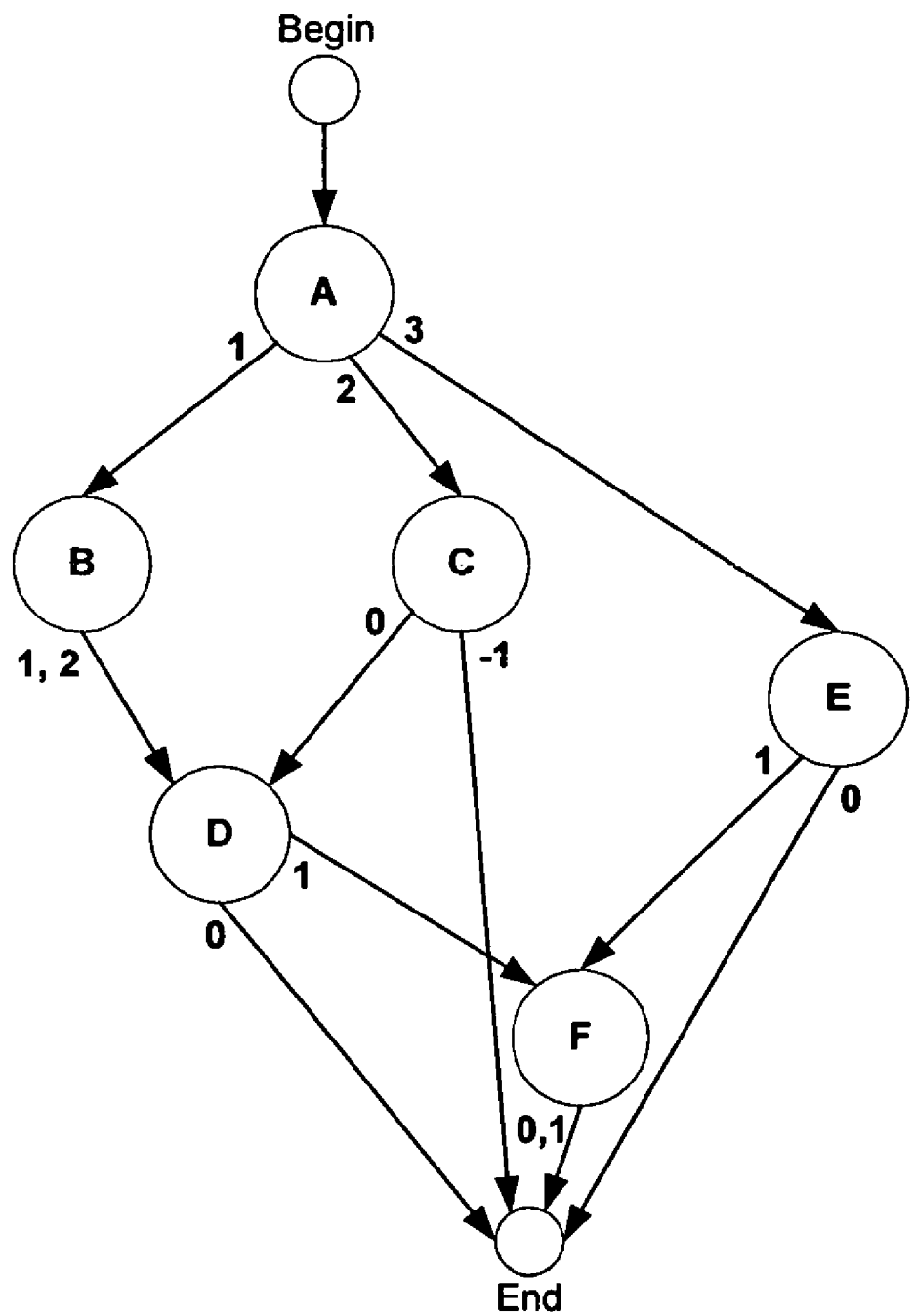
FIG. 3a illustrates a test flow graph according to an embodiment of the present invention.

FIG. 3a illustrates a test flow graph according to an embodiment of the present invention. As shown in FIG. 3a, the test flow graph is a directed graph that includes an entry node (begin), an exit node (end), and six tests A, B, C, D, E, and F through their encapsulating flow items. The label on an edge represents the return result from the test (the source vertex for that directed edge) that causes the flow execution to make a transition to the next test (the destination vertex for that edge). Thus, for example, after execution of test A, if the return status is "1", "2", or "3", the DUT is next tested with test B, test C, or test E respectively. Similarly, an execution result of either "1" or "2" for test B results in test D being executed next. A result of "−1" on executing test C may constitute a rejection of the DUT, leading to a transition directly to the end of the flow for the rejected DUT. Similarly, a result of "0" on executing test F might also constitute a rejection of the DUT, leading again to a transition directly to the end of the flow for the rejected DUT, while a result of "1"

on executing F, while not indicating a rejection, also leads to a transition to the end, simply because there are no more tests left to run.

A fundamental difference between the single-SiteC-per-DUT flow and the flow for parallel testing is that the execution of any test vertex in the flow graph may cause different DUTs to produce different results, thereby leading to the situation that multiple directed edges may need to be followed next, one for each set of DUTs that returns that particular result. That is, there may be different tests to be executed for different DUTs at the same time. For example, in the single DUT case, if test A returns the result "2", the flow automatically executes test C on it next. However, if the flow executes test A on five DUTs, and DUTs 1 and 5 each returns the result "1", they need to proceed to test B next. At the same time, if DUTs 2 and 4 return the result "3", they need to proceed instead to test E, while if DUT 3 returns the result "2", it needs to proceed to test C next. This is where the need for scheduling the DUTs to be executed becomes quite apparent.

The visualization of the test flow as a weakly connected, directed graph presents the following method for scheduling the DUTs for execution:

1. Starting from the entry point of the test flow graph, at each vertex v, determine the set of vertices that the multiple DUT test results indicate are traversed next, say, Vnext.
2. Execute, as the next test, each vertex v as a subset of Vnext, for its corresponding DUTs. Note that while the DUTs for the vertex v that is about to be executed next are placed in the Active category, all the DUTs scheduled for the vertices {Vnext−v} are placed temporarily in the On-Hold category. Similarly, when the next vertex, say v', in Vnext is scheduled for execution, the DUTs for the vertex v that just completed execution transition from the Active state to the On-Hold state, while the DUTs for v' transition from the On-Hold state to the Active state.
3. Repeat steps 1 and 2 above for every vertex encountered (or "visited"), until all DUTs have reached the exit vertex for the test flow. Note that the process illustrated above is essentially "visiting" every vertex in the flow graph that is reachable (i.e., lies on a directed path) from the source vertex, the directed paths being determined by the return value(s) of test execution at each visited vertex. This leads directly to the result that any complete traversal mechanism for a (weakly) connected, directed graph (e.g., depth-first traversal or breadth-first traversal) beginning at the source vertex, and constrained by the selected outgoing edges at each visited vertex, effectively implements the above algorithm for DUT execution scheduling.

Figure 3B:
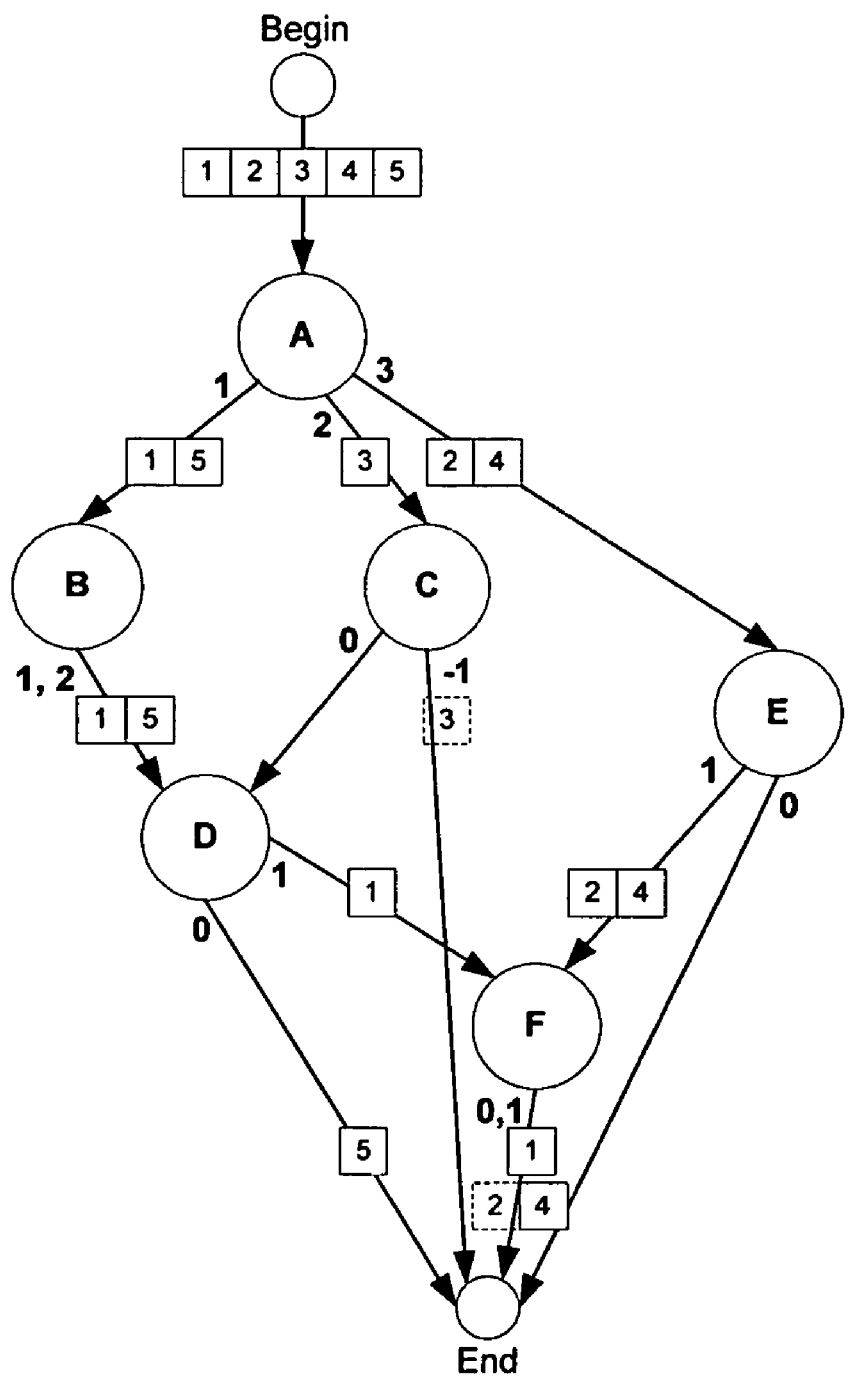
FIG. 3b illustrates a method for testing DUTs through the test flow graph of FIG. 3a according to an embodiment of the present invention.

FIG. 3b illustrates a method for testing DUTs through the test flow graph of FIG. 3a according to an embodiment of the present invention. In one approach, a depth-first traversal mechanism is employed. Table 1 shows the DUT execution scheduling using depth-first traversal of the test flow graph. In this example, the DUT States are Active (a), On-Hold (h), and Rejected (r). All Measurable DUTs are considered to be Active when they first enter the test flow. DUTs that have completed testing without being rejected are considered to be in the Active state when they complete flow execution. Note that this is a consideration for only top-level test flows, and is necessary not only for preserving a consolidated view of flow execution for external users, who expect to see nothing but Active DUTs (since the On-Hold state only holds meaning for the flow's internal scheduling activities), but also because any user-specified "End-Sequences" (for special powering-down requirements) can only be applied effectively to Active DUTs. Hence, the last row of Table 1 shows how the flow restores the On-Hold DUTs 1 and 5 to the Active state before the flow exits.

TABLE 1

| Test Execution | DUT Results | | | | | Scheduled Next Test | DUT States | | | | |
|---|---|---|---|---|---|---|---|---|---|---|---|
| | 1 | 2 | 3 | 4 | 5 | | 1 | 2 | 3 | 4 | 5 |
| — (Begin) | — | — | — | — | — | A | a | a | a | a | a |
| A | 1 | 3 | 2 | 3 | 1 | B | a | h | h | h | a |
| B | 2 | — | — | — | 1 | D | a | h | h | h | a |
| D | 1 | — | — | — | 0 | F | a | h | h | h | h |
| F | 1 | — | — | — | — | C | h | h | a | h | h |
| C | — | — | −1 | — | — | E | h | a | r | a | h |
| E | — | 1 | — | 1 | — | F | h | a | r | a | h |
| F | — | 0 | — | 1 | — | — (End) | a | r | r | a | a |

In each row, the DUT states that are given are those resulting from the scheduling decision that takes place after the execution of the test in that row (given by the "Test Execution" column). For example, after test A is executed, and the flow schedules test B next, since only DUTs 1 and 5 are meant to be tested by test B at that point, they are kept Active, while DUTs 2, 3, and 4 are placed On-Hold. The result "−1" from test C is an indication that the DUT is rejected, as is the result "0" from test F. The edges labeled "0" out of both C and E are not traversed at all, since no DUT being executed at those vertices returns the result "0". Thus, the flow graph traversal is constrained by the outgoing edges that can be meaningfully selected, at each visited vertex.

Note that Table 1 shows that the test F is executed twice, once for DUT 1, and once again for DUTs 2 and 4. This is because of the depth-first traversal-based scheduling, and this happens regardless of whether there are hardware resources available for applying F on all three DUTs at the same time or not.

In general, while a complete test flow graph traversal mechanism for a (weakly) connected, directed graph is guaranteed to visit all the vertices (i.e., in the case of the test flow graph, schedule all the DUTs for execution along the directed paths that they follow singly), neither a depth-first nor a breadth-first search of a general directed flow graph can assure that the same vertex is not visited more than once (i.e., assure that the same test is not executed more than once). However, being able to provide this assurance is desirable, since it reduces the overhead of parallel DUT testing over that of testing a single DUT.

In another embodiment, DUT execution scheduling may be performed based on topological order. In other words, if a connected, directed graph is traversed in topological order, this assurance can indeed be given. A connected, directed graph G is said to be amenable to topological sorting, if it is possible to list all its vertices in an ordered sequence S, such that for all vertices v, w is a subset of G, and if there is an edge from v to w, then v precedes w in the sequential listing S. Such a sequence S is referred to as a topological ordering of the connected, directed graph G. Traversing G in topological order, from its source to its sink vertex, guarantees that while all the vertices are visited, no vertex is visited more than once.

For example, topologically sorting the vertices of the test flow graph shown in FIG. 3a results in the following ordered sequence: {Begin, A, B, C, E, D, F, End}. Note that such sequences are not necessarily unique; in fact, another equivalent topological ordering of the same graph is: {Begin, A, B, C, D, E, F, End}.

The scheduling of DUT executions when following the topological ordering {Begin, A, B, C, E, D, F, End} of the test flow graph is shown in Table 2.

TABLE 2

| Test Execution | DUT Results | | | | | Scheduled Next Test | DUT States | | | | |
|---|---|---|---|---|---|---|---|---|---|---|---|
| | 1 | 2 | 3 | 4 | 5 | | 1 | 2 | 3 | 4 | 5 |
| — (Begin) | — | — | — | — | — | A | a | a | a | a | a |
| A | 1 | 3 | 2 | 3 | 1 | B | a | h | h | h | a |
| B | 2 | — | — | — | 1 | C | h | h | a | h | h |
| C | — | — | -1 | — | — | E | h | a | r | a | h |
| E | — | 1 | — | 1 | — | D | a | h | r | h | a |
| D | 1 | — | — | — | 0 | F | a | a | r | a | h |
| F | 1 | 0 | — | 1 | — | — (End) | a | r | r | a | a |

An arbitrary (weakly) connected, directed graph may not necessarily have a topological order. In fact, it can be shown that a topological ordering for a connected, directed graph exists if and only if the graph is acyclic (i.e., has no directed cycles). A connected, directed graph is said to have a directed cycle if, for at least one of its vertices v, there exists a directed path from v, including at least one other vertex w not equal to v, back to v. Hence, the restriction on a test flow graph, in order for a topological-order-based DUT execution scheduling method to work, is that it be free of directed cycles.

Note that the implementation of the flow-scheduling mechanism in the test system first attempts to topologically order the test flow graph; if successful (i.e., there are no directed cycles), the specialized method for DUT execution scheduling based on topological order is used; otherwise (i.e., there are one or more directed cycles), the general method for DUT execution scheduling is used.

In order to simplify the operations related to changing the states of DUTs during flow execution, or placing them in different categories, the TOS uses an IDUTManipulator interface (the object implementing this interface is a singleton in a SiteC). The following are examples of the methods that are supported by this interface:

get*DUTs([out] array_of_DUT_IDs): Returns the array of DUT IDs for the DUTs currently in category "*", where "*" is one of "Defined", "Loaded", "Measurable", "Active", "On-Hold", or "Rejected".

is*DUT([in] array_of_DUT_IDs): Tests whether the given set of DUT IDs are in the category "*", where "*" is one of "Defined", "Loaded", "Measurable", "Active", "On-Hold", or "Rejected". Returns false if at least one given DUT is not.

rejectDUTs([in] array_of_DUT_IDs, useEndSeq, isolateElectrically): Permanently rejects the given DUTs from further testing (valid only for DUTs currently in the Measurable category). The last two parameters are flags to allow the user to specify whether the corresponding action is required or not.

putDUTsOnHold([in] array_of_DUT_IDs, useEndSeq, isolateElectrically): Puts the given DUTs in the On-Hold state (valid only for DUTs currently in the Active category). The last two parameters are flags to allow the user to specify whether the corresponding action is required or not.

makeDUTsActive([in] array_of_DUT_IDs, useEndSeq, isolateElectrically): Puts the given DUTs in the Active state (valid only for DUTs currently in the On-Hold state). The last two parameters are flags to allow the user to specify whether the corresponding action is required or not.

As described above, the IDUTManipulator interface is available for verifying DUT state information, as well as for efficiently effecting DUT state transitions during test flow execution. Given the general and specialized methods for DUT execution scheduling discussed above, the use of the IDUTManipulator interface during flow execution further includes:

The object for implementing the IDUTManipulator interface is a singleton in a SiteC, and maintains global information regarding the DUT states. Thus, DUT state transitions that take place during a flow execution are effected only through the IDUTManipulator interface.

DUT state transitions often involve expensive module operations, such as relay control, power sequencing, etc. If the state transitions were performed separately for each DUT in a set of DUTs that required them, it would be inefficient. The IDUTManipulator interface thus has methods for these operations that take multiple DUTs as a parameter, so that the specified DUTs are taken care of with a single operation (which implies that hardware support for doing this is available). For example, when the flow makes a scheduling decision, for the greatest efficiency, it first computes the complete set of DUTs that are required to transition from Active to On-Hold state (or vice versa) as a result of the decision, and then uses the IDUTManipulator methods that perform the state transition operation all at once for the entire set of DUTs.

The DUT sets that IDUTManipulator methods return are not scoped to any specific flow branch. For example, the set of On-Hold DUTs returned by getOnHoldDUTs( ) represents all DUTs currently On-Hold globally.

The IDUTManipulator interface is not available to user test classes, since it is potentially dangerous to give user test classes access to global DUT state information, such as the DUTs that are currently On-Hold, etc. If a test class had free access to the IDUTManipulator methods, a user coding error might lead to a corruption of the flow-wide DUT state information used by the DUT execution scheduling mechanism. When a user test class instance starts to execute, it only needs to know the subset of Active DUTs.

However, when a user test class instance is required to be executed, if the system does not have enough hardware resources to measure all DUTs in a SiteC at the same time, these devices are tested sequentially (or in batches, with as many devices as can be tested at once per batch) by the test class. Note that some DUTs may have already been marked as Rejected, and they do not need to be tested any further.

To facilitate sequential testing of DUTs, the TOS makes available an iterator object to iterate through all DUTs, which is capable of skipping the Rejected DUTs. A specialization of this general iterator is also available, to automatically place all DUTs (in the set currently being considered) On-Hold, except the one pointed to by the iterator, which is placed in the Active state. Test classes are able to instantiate the iterator objects and use them. While using the iterators within a test class, it is important to note that the iterator only iterates through the active DUTs for that test class, and not all globally active DUTs.

To accommodate cases where the iterator cannot be used, when a test instance is executed, it is handed an instance of a reduced DUT manipulator object, which implements the IUserDUTManipulator interface. The system constructs this object with specifically the subset of Active DUTs that are meant for that test instance at that point in the DUT execution schedule for the flow. The test class uses this object to query about only the Active or On-Hold states of the DUTs it is constructed with, and issues commands to place any DUT within that set from Active to On-Hold, if it needs to. Note that this reduced interface does not allow immediate DUT rejection. Rejection still has to be effected through the test plan code, which allows the result of the test execution for the DUT in question to dictate the course of action once the test execution has been completed. If the test instance desires to suspend testing and reject a DUT, all it has to do is to place the DUT On-Hold, and provide the appropriate test result to the flow on exit.

Note that the Active and On-Hold states used for sequential test support are quite different in nature from the corresponding states used for DUT execution scheduling by the flow, and are private to the test instance. The two sets have no bearing on each other. As far as the flow is concerned, all DUTs entering a test for execution are in the flow's Active state, as they still are when execution of the test has just completed, and before the next scheduling decision has been made.

In addition to the flows discussed above, the open architecture test system supports several flows that are not directly concerned with executing DUT tests, such as configurable pattern load flows, lot-start and lot-end flows, etc., and includes flows that actually run on the SysC. In this section, modifications that are necessary to the existing organization of the open architecture test system of flows and related elements, in order to efficiently accommodate multi-DUT parallel testing on a single SiteC, are described. Then the enhancements to the test system for supporting parallel testing are described.

For flows that execute tests, during parallel DUT testing, the IFlowable (or ITest) that is being executed at a particular flow item needs to support a DUT-specific getStatus( ) method, since different DUTs can return different results. The existing IFlowable::getStatus( ) method as used in FIG. 1 does not take any parameters, and thus it is inadequate for flows involving multiple DUTs.

Figure 4:
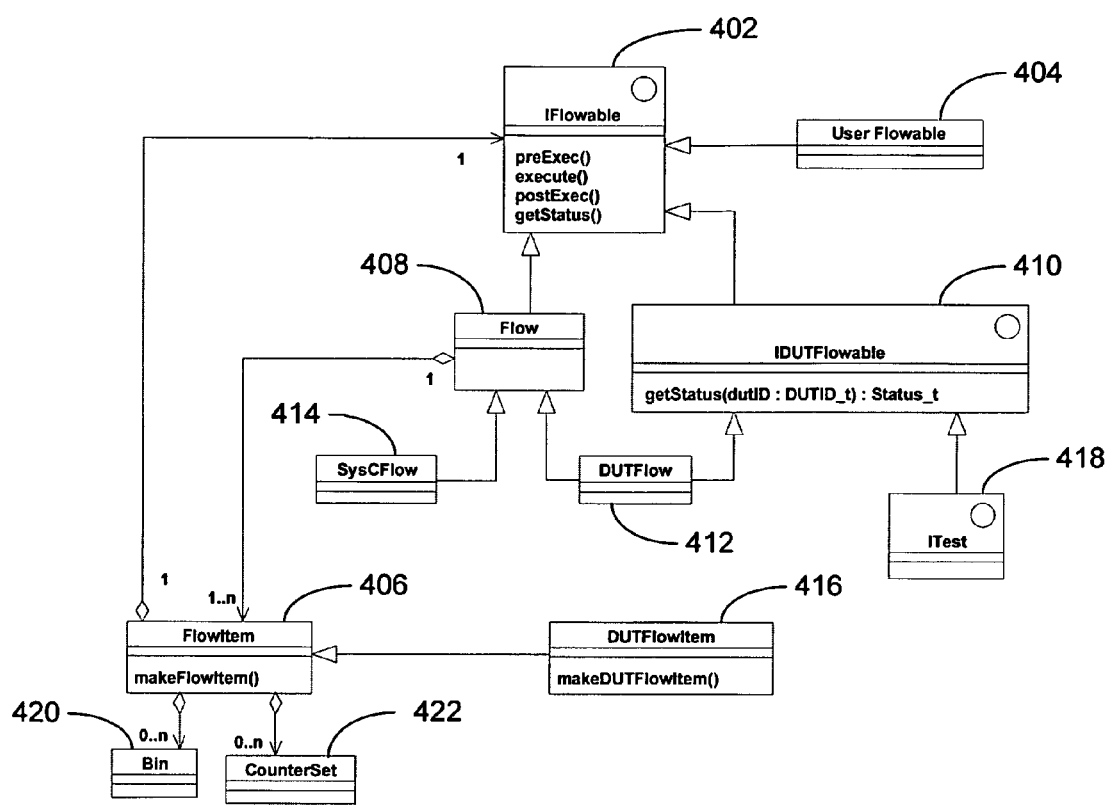
FIG. 4 illustrates an implementation of test flow system architecture according to an embodiment of the present invention.

In one approach, a new IDUTFlowable interface that extends the IFlowable interface by adding the getStatus( ) method with a DUT ID as a parameter, is implemented. Following through with this modification, a DUTFlow that includes DUTFlowItem objects is also implemented. The resulting architecture allows a flow to include any flow item object, but a DUTFlow to contain only DUTFlowItem objects. FIG. 4 illustrates an implementation of test flow system architecture according to an embodiment of the present invention. As shown in FIG. 4, the flow system architecture includes an IFlowable interface 402, a User Flowable class 404, a FlowItem class 406, a Flow class 408, an IDUTFlowable interface 410, a DUTFlow class 412, a SysCFlow class 414, a DUTFlowItem class 416, an ITest interface 418, a Bin class 420, and a CounterSet class 422.

The IFlowable interface 402 is used by any classes to be executed within the flow execution context. The User Flowable class 404 is a direct implementation of IFlowable. This is implemented when a user wants to execute any of its code during flow execution, and the code can implement an IFlowable interface. The main flow to test the DUTs is through the DUTFlow class 412, and its element is derived from the IDUTFlowable interface 410. As a result, the User Flowable class 404 is not part of the main flow. The FlowItem class 406 defines transitions from a node in the test flow graph. It is associated with an IFlowable object. A FlowItem and an IFlowable logically realize a node in the test flow graph.

The Flow class 408 refers to an IFlowable object to realize a state machine by executing IFlowable to IFlowable based on the transitions specified in each FlowItem. In addition, the Flow class is a container of FlowItem objects. The Flow class is derived from an IFlowable object. Each FlowItem object is associated with an IFlowable object. The IDUTFlowable interface 410, which derives from the IFlowable interface 402, is a new base class for multi-DUT flows. The difference between an IDUTFlowable object and an IFlowable object is that the IDUTFlowable object has a method for the system to receive DUT-specific status to force all derived classes, such as the DUTFlow-derived and ITest-derived classes, to return DUT-specific status.

Multi-DUT flow items are represented by the new DUTFlowItem class 416, which extends the original flow item class with the support of parallel-test specific state transition. In addition, the DUTFlow class 412 extends the Flow class 408 with the implementation of test scheduling (determination of the test to execute next, which DUTs to test on the test) based on DUT-specific status returned from IDUTFlowable-derived objects and the state transition defined in DUTFlowItem. A Flow may contain any FlowItem object, but a DUTFlow is constrained to contain only DUTFlowItem objects. Note that the Flow maintains ownership of a set of pointers to flow items, which can include pointers to DUTFlowItems. The DUTFlow class 412 ensures that its pointers (i.e., the members in the base Flow class) are all DUTFlowItems, by dynamically down-casting these pointers to DUTFlowItems through a protected interface in the base Flow class. The DUTFlow class 412 is an IDUTFlowable-derived class. The DUTFlow is a main flow to test DUTs, and it exists only in SiteC.

The ITest interface 418 is an IDUTFlowable-derived interface specialized with methods for test instances, such as a method to handle parameters specified from GUI application. All tests that are executed on DUTs are considered to be multi-DUT-capable by default. Since single and multiple DUTs are treated with the same facility by the test, they can be used without making changes in either environment (the single DUT case is the degenerative case of the multi-DUT case, where the number of DUTs in the same SiteC is one). Hence, the ITest may be derived from the IDUTFlowable instead of from IFlowable. The Bin class 420 and CounterSet class 422 are derived from the FlowItem class 406. The SysCFlow class 414 is a new flow class that is introduced to handle flows on the SysC.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for scheduling tests in a parallel test system comprising at least two devices-under-test (DUTs) coupled to a test controller through one or more vendor hardware modules, comprising:
   receiving a test plan comprising a plurality of tests arranged in a predetermined test flow, wherein the predetermined test flow comprises a plurality of tests arranged in a directed graph, and wherein each test is arranged as a vertex in the directed graph;
   determining a test execution schedule in accordance with the test plan at runtime, wherein the test execution schedule identifies a set of next tests to be executed according to current states of the at least two DUTs, and wherein the set of next tests include different tests to be performed on different DUTs; and
   testing the at least two DUTs using the test execution schedule.

2. The method of claim 1, wherein the directed graph comprises:
   a plurality of vertices connected in a hierarchical fashion with a plurality of directed edges, each vertex of the directed graph represents a test, and each vertex comprises zero or more sub-flows; and
   each directed edge of the directed graph represents a transition from a source test to a destination test based on outcome of the source test.

3. The method of claim 1, wherein determining a test execution schedule at runtime comprises:
   determining whether the test flow is free of directed cycles;
   determining a next set of vertices to be traversed for testing the at least two DUTs if the test flow has directed cycles; and
   executing tests in accordance with the next set of vertices to be traversed.

4. The method of claim 3, wherein determining a next set of vertices to be traversed comprises applying a traversal mechanism selected from the group consisting of depth-first traversal and breadth-first traversal.

5. The method of claim 3, wherein executing tests comprises:
   creating DUT states according to results of a test on the at least two DUTs, wherein DUT states include active, on-hold, and rejected states;
   executing different tests on the at least two DUTs according to current states of the at least two DUTs.

6. The method of claim 5, wherein creating DUT states comprises categorizing the DUT states based on failure of a test by the at least two DUTs.

7. The method of claim 3, wherein executing tests comprises:
   creating DUT categories according to results of a test on the at least two DUTs, wherein the DUT categories include defined, loaded, measurable, on-hold, and active categories; and
   executing different tests on the at least two DUTs according to the DUT categories of the at least two DUTs.

8. The method of claim 1, wherein determining a test execution schedule at runtime further comprises:
   determining whether the test flow is free of directed cycles;
   determining a next set of vertices to be traversed for testing the at least two DUTs if the test flow has no directed cycles; and
   executing tests in accordance with the next set of vertices to be traversed.

9. The method of claim 8, wherein the next set of vertices is arranged in a topological order, and wherein no vertex is traversed more than once.

10. The method of claim 1 further comprising:
    replicating pattern data across the at least two DUTs automatically; and
    replicating test conditions across the at least two DUTs automatically.

11. A parallel test system, comprising:
    a test controller;
    one or more hardware modules coupled to the test controller;
    at least two devices-under-test (DUTs) coupled to each hardware module in parallel;
    means for receiving a test plan comprising a plurality of tests arranged in a predetermined test flow, wherein the predetermined test flow comprises a plurality of tests arranged in a directed graph, and wherein each test is arranged as a vertex in the directed graph;
    means for determining a test execution schedule in accordance with the test plan at runtime, wherein the test execution schedule identifies a set of next tests to be executed according to current states of the at least two DUTs, and wherein the set of next tests include different tests to be performed on different DUTs; and
    means for testing the at least two DUTs using the test execution schedule.

12. The system of claim 11, wherein the directed graph comprises:
    a plurality of vertices connected in a hierarchical fashion with a plurality of directed edges, each vertex of the directed graph represents a test, and each vertex comprises zero or more sub-flows; and
    each directed edge of the directed graph represents a transition from a source test to a destination test based on outcome of the source test.

13. The system of claim 11, wherein the means for determining a test execution schedule at runtime comprise:
    means for determining whether the test flow is free of directed cycles;
    means for determining a next set of vertices to be traversed for testing the at least two DUTs if the test flow has directed cycles; and
    means for executing tests in accordance with the next set of vertices to be traversed.

14. The system of claim 13, wherein the means for determining a next set of vertices to be traversed comprise means for applying a traversal mechanism selected from the group consisting of depth-first traversal and breadth-first traversal.

15. The system of claim 13, wherein the means for executing tests comprise:

means for creating DUT states according to results of a test on the at least two DUTs, wherein DUT states include active, on-hold, and rejected states;

means for executing different tests on the at least two DUTs according to current states of the at least two DUTs.

16. The system of claim 15, wherein the means for creating DUT states comprise means for categorizing the DUT states based on failure of a test by the at least two DUTs.

17. The system of claim 13, wherein the means for executing tests comprise:

means for creating DUT categories according to results of a test on the at least two DUTs, wherein the DUT categories include defined, loaded, measurable, on-hold, and active categories; and means for executing different tests on the at least two DUTs according to the DUT categories of the at least two DUTs.

18. The system of claim 11, wherein the means for determining a test execution schedule at runtime further comprise:

means for determining whether the test flow is free of directed cycles;

means for determining a next set of vertices to be traversed for testing the at least two DUTs if the test flow has no directed cycles; and means for executing tests in accordance with the next set of vertices to be traversed.

19. The system of claim 18, wherein the next set of vertices is arranged in a topological order, and wherein no vertex is traversed more than once.

20. The system of claim 11 further comprising:

means for replicating pattern data across the at least two DUTs automatically; and means for replicating test conditions across the at least two DUTs automatically.

* * * * *